United States Patent [19]

Naito et al.

[11] Patent Number: 5,061,509
[45] Date of Patent: Oct. 29, 1991

[54] METHOD OF MANUFACTURING POLYIMIDE THIN FILM AND METHOD OF MANUFACTURING LIQUID CRYSTAL ORIENTATION FILM OF POLYIMIDE

[75] Inventors: Katsuyuki Naito, Yokohama; Shinya Aoki, Kawasaki; Toshio Nakayama, Fujisawa, all of Japan

[73] Assignee: Kabushiki Kaisha Toshiba, Kawasaki, Japan

[21] Appl. No.: 571,119

[22] Filed: Aug. 23, 1990

[30] Foreign Application Priority Data

Aug. 25, 1989 [JP] Japan .................................. 1-219395

[51] Int. Cl.$^5$ .......................... B05D 1/04; B05D 3/06; C08J 3/28; C08G 69/26
[52] U.S. Cl. ..................................... 427/13; 427/54.1; 522/164; 528/350; 528/352; 528/353
[58] Field of Search ................ 427/54.1, 13; 528/350, 528/352, 353; 522/164

[56] References Cited

U.S. PATENT DOCUMENTS

3,686,022 8/1972 White et al. ........................ 522/164
4,590,103 5/1986 Ahne et al. ........................ 427/389.7

Primary Examiner—Marion E. McCamish
Assistant Examiner—Mark A. Chapman
Attorney, Agent, or Firm—Oblon, Spivak, McClelland, Maier & Neustadt

[57] ABSTRACT

A polyimide thin film is formed on a substrate by imparting energy under vacuum, by means of heating, ultraviolet light or electron beam irradiation, or a combination thereof, to a polyimide having in the polymer main chain imide bonds and decomposable bonds such as carbon-carbon single bond differing from the imide bonds so as to break the decomposable bonds.

12 Claims, 3 Drawing Sheets

METHOD OF MANUFACTURING POLYIMIDE THIN FILM AND METHOD OF MANUFACTURING LIQUID CRYSTAL ORIENTATION FILM OF POLYIMIDE

BACKGROUND OF THE INVENTION

1. Field of the Invention

The present invention relates to a method of manufacturing a polyimide thin film and to a method of manufacturing a liquid crystal orientation film of polyimide.

2. Description of the Related Art

Recently, very thin films of organic materials having a thickness of about 100 nm attract attentions in this technical field. The thin films of this type are mainly insulating thin films such as insulating protective films for semiconductor devices, dielectric thin films for capacitors and liquid crystal orientation films.

Thin films can be formed by, for example, a wet process or a dry process. It is known to the art that, when it comes to the insulating protective films for semiconductor devices, polyimide films are formed by the wet process. However, it is said to be desirable to form the polyimide films by the dry process. In general, it is difficult to remove dust in the case of the wet process. In addition, the wet process is incompatible in many cases with the process of manufacturing semiconductor devices because the dry process is mainly employed for the manufacture of the semiconductor devices. When it comes to the formation of a liquid crystal orientation film which permits orientation of liquid crystal molecules, it is known to the art to employ an oblique vapor deposition of inorganic materials. It is also known that a coating of a silane coupling agent or an organic high molecular weight compound is formed first, followed by rubbing the coating. However, the cell gap is small in a liquid crystal element using a ferroelectric liquid crystal material. It follows that, if the orientation film is nonuniform in thickness or dust is attached to the film formed by the wet process, the orientation of the liquid crystal molecule is rendered poor, leading to decisive defects in the characteristics of the liquid crystal element.

As described above, the wet process generally gives rise to a difficulty in terms of the dust removal. Further, the specific techniques falling within the scope of the wet process give rise to individual problems inherent therein. To be more specific, a solvent casting method is one of the most popular techniques of the wet process for forming a thin film. It is known to the art that the spin coating method, i.e., a kind of the solvent casting method, permits forming a thin film of about 10 nm in thickness depending on the kind of the polymer used. In this case, however, it is difficult to form a thin film having a uniform and dense structure and a high insulating property.

Also, attentions are attracted by the technique of forming an LB film of an organic material on the surface of, for example, a semiconductor or metal substrate for allowing the LB film to perform the function of an insulating film. Recently, vigorous researches are being made on the technique of improving the heat resistance and the mechanical strength of the LB film. For example, it is reported in "Electronics Letters, 20, No. 12, p. 489 (1984)" that a condensed cyclic compound excellent in heat resistance is incorporated in an organic composition used for forming a thin film. Also, the use of a low molecular weight compound, which is incapable of polymerization, in combination with a high molecular weight compound is reported in "Journal of Colloid and Interface Science, 79, p. 268 (1981)". Further, the idea of forming a film of a low molecular weight compound capable of polymerization, followed by the polymerization treatment, is reported in "Thin Solid Films, 99, p. 249 (1983)". Further, a film formation from a vinyl polymer is reported in "Journal of Colloid and Interface Science, 131, p. 218 (1989)". However, the LB film formed by any of these prior arts fails to exhibit sufficient heat resistance and mechanical strength.

Recently, a method of forming a polyimide film by the LB method is reported in, for example, "Polymer Preprints, Japan Vol. 36, No. 10, p. 3215 (1987)". It should be noted that polyimide exhibits the highest heat resistance and the highest mechanical strength among the organic materials. However, in order to convert a polyimide precursor thin film into a polyimide thin film, a treatment with chemicals is required as described in "Thin Solid Films, 160, p. 15 (1988)", or a heat treatment at such a high temperature as about 300° C. is required as described in "Thin Solid Films, 160, p. 21 (1988)". The use of a polyimide film formed by the LB method is also reported with respect to a liquid crystal orientation film in, for example, Published Unexamined Japanese Patent Application No. 63-52119. Rubbing need not be employed in this technique. In addition, it is possible to form a very thin film, making it possible to eliminate the coloring problem caused by polyimide. In this technique, however, it is also necessary to employ a treatment with chemicals or a heat treatment. What should be noted is that such a treatment possibly brings about undesirable results depending on the element in which said polyimide film is used.

The LB method is featured in that a monomolecular film formed on the water surface is accumulated on a solid substrate. In order to use an LB film as an electrically insulating thin film, it is necessary for the film to have a thickness of at least 100 nm so as to prevent the flow of a tunnel current. Naturally, it is necessary to superpose many LB films one upon the other, leading to a long manufacturing time of the insulating film. The LB method is also defective in that the kinds of molecules used for forming the monomolecular film are much restricted.

A water surface spreading method, which resembles the LB method, is also known as a method of forming a thin film. For example, polymers having a flexible molecular chain and soluble in an organic solvent such as polyvinylidene fluoride copolymer, polystyrene and polysiloxane do not form a monomolecular film on the water surface, but are known to form a thin film about 10 nm thick (see, for example, "Polymer Preprints, Japan Vol. 36, No. 10, p. 2250 (1987)" and "Polymer preprints, Japan Vol. 38, No. 12, p. 884 (1989)"). However, many heat-resistant polymers such as polyimide are insoluble in general in an organic solvent, making it impossible to apply the water surface spreading method to these polymers. Certainly, some polyimides having a particular molecular structure are soluble in an organic solvent. However, since polyimide has a rigid molecular chain and a strong force of association among molecules, the polymer molecules fail to be spread sufficiently on the water surface. It follows that a very thin film cannot be formed in many cases.

On the other hand, it is also possible to employ a dry process such as a vacuum vapor deposition for forming a thin polymer film. In order to solve the problem of dust attachment which is inherent in the wet process, it is most desirable to employ a dry process utilizing a vacuum system. As a matter of fact, thin films of polyethylene or polytetrafluoroethylene are actually manufactured by the vacuum vapor deposition method. However, it is generally difficult to employ the vacuum vapor deposition for forming a heat resistant film such as a polyimide film. To overcome the difficulty, it is proposed to perform vapor deposition of two kinds of monomers for polymerization on a substrate so as to prepare polyimide (see, for example, "Polymer Preprints, Japan Vol. 37, p. 286 (1988)"). In this proposal, however, it is difficult to set the optimum conditions for the vapor deposition. Also, it is difficult to obtain polyimide having a sufficiently large molecular weight.

SUMMARY OF THE INVENTION

An object of the present invention is to provide a method of manufacturing a polyimide thin film having a high heat resistance and a high mechanical strength by utilizing a dry process and a method of manufacturing a polyimide liquid crystal orientation film excellent in the capability of orienting liquid crystal compounds.

According to the present invention, there is provided a method of manufacturing a polyimide thin film, in which energy is imparted under vacuum to polyimide having in the polymer main chain imide bonds and decomposable bonds differing from imide bonds so as to break the decomposable bonds and, thus, to form a polyimide thin film on a substrate.

The present invention also provides method of manufacturing a polyimide liquid crystal orientation film, in which energy is imparted under vacuum to polyimide having in the polymer main chain imide bonds and decomposable bonds differing from imide bonds so as to break the decomposable bonds and, thus, to form a polyimide thin film on a substrate in an oblique direction relative to the substrate.

These methods easily permit achieving the above-noted object of the present invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The polyimide used in the present invention has imide bonds and decomposable bonds differing from the imide bonds in the polymer main chain. The decomposable bonds noted above include, for example, carbon-carbon single bond, carbon-oxygen single bond, carbon-sulfur single bond, oxygen-silicon single bond, carbon-silicon single bond, carbon-nitrogen single bond and silicon-silicon single bond. It is necessary for the polymer main chain of the polyimide to have at least one of these decomposable bonds. The polyimide used in the present invention can be synthesized by the reaction between tetracarboxylic acids or anhydrides thereof and diamines. Of course, one of the reactants should have a decomposable bond noted above. It is not absolutely necessary for the other reactant to have a decomposable bond. By the contrary, it is desirable in terms of the heat resistance for the other reactant not to have a decomposable bond as far as one of the reactants has a decomposable bond. The molecular weight of the polyimide should desirably be 10,000 or more.

The tetracarboxylic acids having a decomposable bond, which can be used for synthesizing the polyimide used in the present invention, include, for example:

On the other hand, the diamines having a decomposable bond, which can be used for synthesizing the polyimide used in the present invention, include, for example:

-continued

In the present invention, energy is imparted to the polyimide under vacuum so as to break the decomposable bond of the polyimide. The energy source used in the present invention includes heating, sputtering, light irradiation, electron beam irradiation, irradiation with high energy radiation and a combination thereof. If energy is imparted to the polyimide, the decomposable bond such as carbon-carbon single bond, carbon-oxygen single bond, carbon-sulfur single bond, oxygen-silicon single bond, carbon-silicon single bond, carbon-nitrogen single bond or silicon-silicon single bond is broken before the imide bond is broken. The breaking of the decomposable bond permits the molecular weight of the polyimide to be diminished gradually. When the molecular weight is diminished to a certain level, the polyimide runs into the gaseous phase, with the result that a polyimide thin film is formed on a substrate under a high vacuum. The bond once broken is recombined on the substrate so as to increase again the molecular weight of the polyimide thin film. The imide bond is not broken during the process noted above. It follows that the heat resistance of the polyimide thin film is substantially equal to that of the original polyimide under the atmospheric pressure.

As apparent from the mechanism of forming a polyimide thin film described above, it is desirable to impart energy to the polyimide as slowly as possible and to form a film slowly in order to obtain a polyimide thin film having a high molecular weight and a narrow molecular weight distribution. If energy is imparted to the polyimide unduly slowly, however, impurities such as oil molecules within the vacuum pump tend to be appreciably introduced into the formed polyimide thin film, and also it makes the thin film-forming operation troublesome. It is practically desirable to set the growing rate of the polyimide thin film at 1 to 100 nm/min.

The uniformity and molecular weight of the polyimide thin film formed on the substrate are also dependent on the substrate temperature. In general, a high substrate temperature leads to formation of a uniform polyimide thin film of a large molecular weight, though the properties of the formed thin film are somewhat dependent on the kinds of the polyimide and the substrate used. If the substrate temperature is unduly high, however, the polyimide molecules once deposited on the substrate are released from the substrate, making it difficult to form a uniform thin film. Under the circumstances, it is desirable to set the substrate temperature at 50 to 200° C.

The method of the present invention permits easily forming a polyimide thin film excellent in heat resistance and mechanical strength and having the largest molecular weight determined by the conditions such as the degree of vacuum, film growing rate and substrate temperature. Of course, the method of the present invention is superior to the prior art utilizing the vapor deposition of polyimide oligomers.

In the method of the present invention for forming a polyimide liquid crystal orientation film, energy is imparted to a polyimide having in the polymer main chain imide bonds and decomposable bonds differing from the imide bonds so as to break the decomposable bonds and, thus, to form a polyimide thin film on a substrate in an oblique direction relative to the substrate. The particular method of the present invention permits the polyimide main chains to be oriented in a predetermined direction on the substrate. As a result, rubbing need not be employed and, thus, the dust attachment accompanying the rubbing treatment need not be worried about. It follows that the method of the present invention makes it possible to manufacture easily a polyimide liquid crystal orientation film excellent in the capability of orienting liquid crystal molecules.

EXAMPLE 1

Polyimide (1) having a molecular weight of 200,000 was synthesized by the reaction between an aliphatic tetracarboxylic acid having a thermally decomposable carbon-carbon single bond and an aromatic diamine:

A p-type silicon wafer having a diameter of 3 inches was washed with hydrofluoric acid and, then, with water, followed by drying at 150° C. The dried silicon wafer was disposed at a position 10 cm apart from a boat of a vacuum vapor deposition apparatus, and the substrate temperature was set at 100° C. On the other hand, 3 mg of polyimide (1) noted above was put in a tungsten boat, which was evacuated to a vacuum of $10^{-6}$ Torr. Then, an electric current was conducted through the boat for the gradual heating. When the boat was heated to about 500° C., a film thickness meter began to swing. When the film growing rate reached 10 nm/min, a shutter was opened so as to permit a polyimide thin film to be formed on the wafer by vapor deposition. When measured with a tarry step, the polyimide thin film formed was found to have a thickness of 100 nm.

Figure 1:
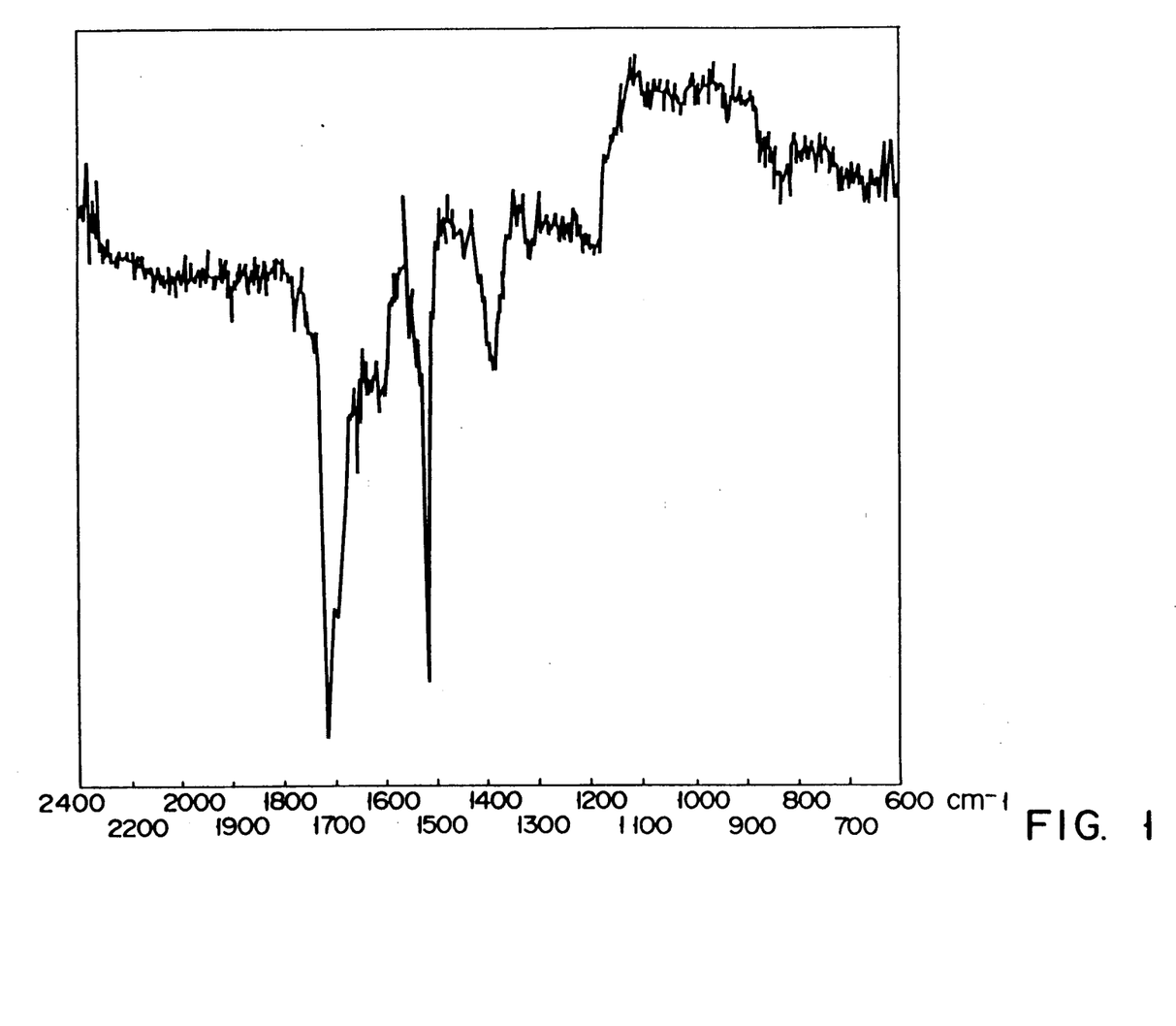
FIG. 1 is an infrared absorption spectrum of the polyimide thin film formed in Example 1 of the present invention described herein later.
Figure 2:
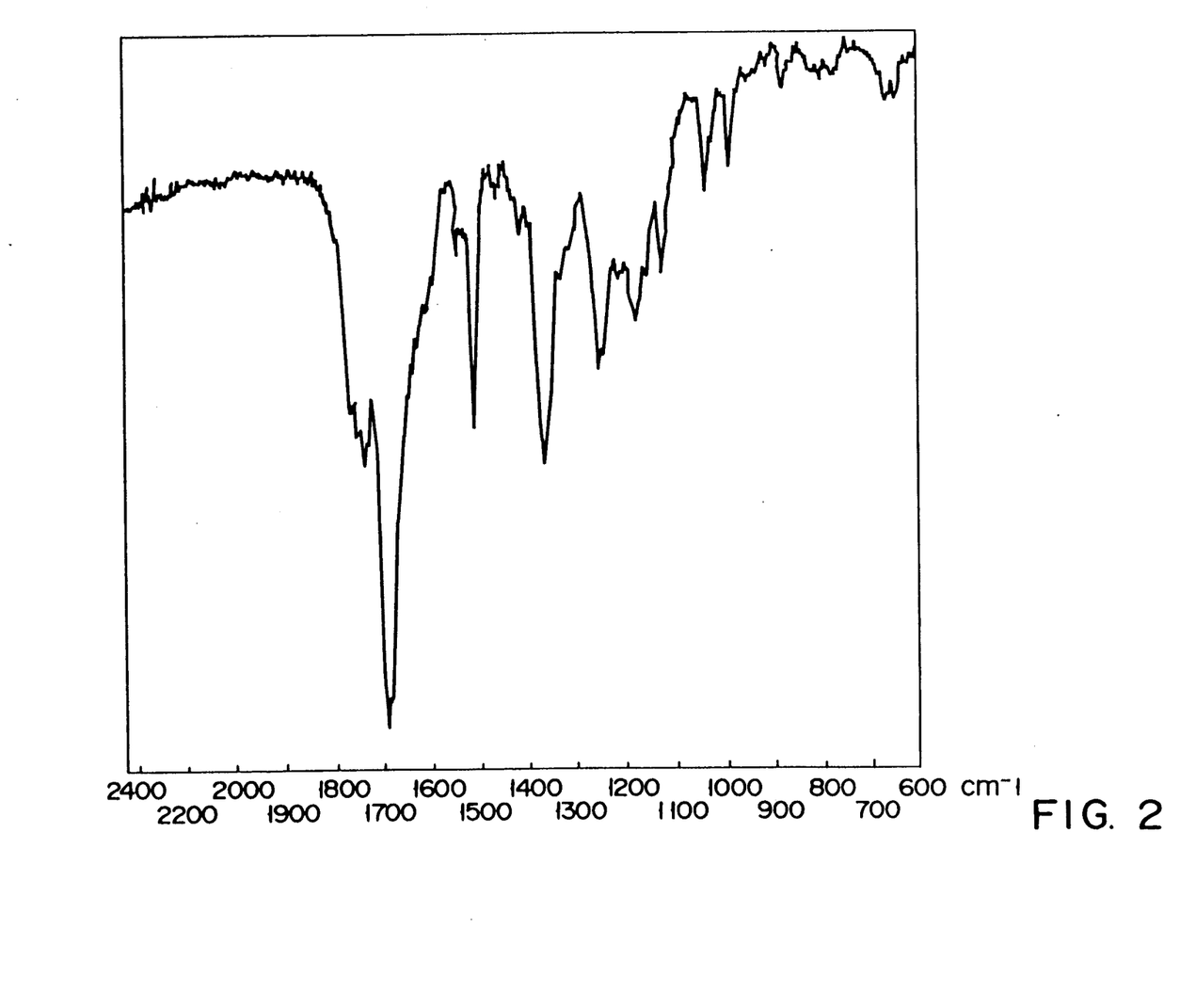
FIG. 2 is an infrared absorption spectrum of polyimide used as a source of vapor deposition in Example 1 of the present invention described herein later.

FIG. 1 shows an infrared (IR) spectrum of the polyimide film thus formed, with FIG. 2 showing an IR spectrum of the original polyimide (KBr method). As seen from FIGS. 1 and 2, absorption of the carbonyl group of imide was observed around 1700 $cm^{-1}$ and absorption of carbon-nitrogen bond of imide around 1380 $cm^{-1}$, supporting the formation of a polyimide thin film.

In the next step, a gold electrode was formed on the polyimide thin film by means of a vacuum vapor deposition. A change in the electrical insulating properties with temperature was measured with respect to the polyimide thin film. The polyimide thin film was found to exhibit a resistivity of $10^{16}$ Ω.cm and a breakdown field strength of $10^6$ V/cm at room temperature. These values remained substantially unchanged over temperatures up to 250° C.

EXAMPLE 2

Polyimide (2) having a molecular weight of about 100,000 was synthesized by the reaction between an aromatic tetracarboxylic acid and an aliphatic diamine having an ether bond (thermally decomposable carbon-oxygen single bond):

A polyimide thin film 80 nm thick was formed and a change in the electrical properties with temperature was measured as in Example 1, except that polyimide (2) was used in Example 2. The polyimide thin film was found to exhibit a resistivity of $10^{16}$ Ω.cm and a breakdown field strength of $10^6$ V/cm at room temperature. These values remained substantially unchanged over temperatures up to 170° C.

EXAMPLE 3

Polyimide (3) having a molecular weight of about 120,000 was synthesized by the reaction between an aromatic tetracarboxylic acid and a diamine having a silicon-oxygen single bond:

A polyimide thin film 110 nm thick was formed and a change in the electrical properties with temperature was measured as in Example 1, except that polyimide (3) was used in Example 3. The polyimide thin film was found to exhibit a resistivity of $10^{16}$ Ω.cm and a breakdown field strength of $10^6$ V/cm at room temperature. These values remained substantially unchanged over temperatures up to 180° C.

EXAMPLE 4

Polyimide (4) having a molecular weight of about 150,000 was synthesized by the reaction between an aromatic tetracarboxylic acid and a diamine having a sulfone bond (thermally decomposable carbon-sulfur single bond):

A polyimide thin film 100 nm thick was formed and a change in the electrical properties with temperature was measured as in Example 1, except that polyimide (4) was used in Example 4. The polyimide thin film was found to exhibit a resistivity of $10^{16}$ Ω.cm and a breakdown field strength of $10^6$ V/cm at room temperature. These values remained substantially unchanged over temperatures up to 220° C.

EXAMPLE 5

Polyimide (5) having a molecular weight of about 150,000 was synthesized by the reaction between an aromatic tetracarboxylic acid having an ester bond (thermally decomposable carbon-oxygen single bond) and an aromatic diamine:

A polyimide thin film 100 nm thick was formed and a change in the electrical properties with temperature was measured as in Example 1, except that polyimide (5) was used in Example 5. The polyimide thin film was found to exhibit a resistivity of $10^{16}$ Ω.cm and a breakdown field strength of $10^6$ V/cm at room temperature. These values remained substantially unchanged over temperatures up to 250° C.

EXAMPLE 6

Polyimide (6) having a molecular weight of about 130,000 was synthesized by the reaction between an aromatic tetracarboxylic acid and an aliphatic diamine having an amine bond (thermally decomposable carbon-nitrogen single bond):

A polyimide thin film 100 nm thick was formed and a change in the electrical properties with temperature was measured as in Example 1, except that polyimide (6) was used in Example 6. The polyimide thin film was found to exhibit a resistivity of $10^{16}$ Ω.cm and a breakdown field strength of $10^6$ V/cm at room temperature. These values remained substantially unchanged over temperatures up to 190° C.

EXAMPLE 7

A polyimide thin film 200 nm thick was formed and a change in the electrical insulating properties with temperatures was measured as in Example 1, except that polyimide (1) was subjected to sputtering with argon ions. The polyimide thin film was found to exhibit a resistivity of $10^{16}$ Ω.cm and a breakdown field strength of $10^6$ V/cm at room temperature. These values remained substantially unchanged over temperatures up to 250° C.

EXAMPLE 8

Polyimide (7) having a molecular weight of 70,000 was synthesized by the reaction between an aromatic tetracarboxylic acid and a diamine having a photolytically decomposable silicon-silicon single bond:

4 mg of polyimide (7) thus prepared was put in a tungsten boat, which was evacuated into a vacuum of $10^{-6}$ Torr. Then, an electric current was conducted through the boat for the gradual heating. At the same time, the boat was irradiated with an ultraviolet light having a wavelength of 300 nm. When the boat temperature was elevated to about 200° C., a film thickness meter began to swing. When the film growing rate reached 10 nm/min, a shutter was opened so as to permit a polyimide thin film to be formed on a silicon wafer set at 100° C. by vapor deposition. When measured with a tarry step, the polyimide thin film formed was found to have a thickness of 150 nm.

A change in the electrical insulating properties of the polyimide thin film with temperatures was measured as in Example 1. The polyimide thin film was found to exhibit a resistivity of $10^{16}$ Ω.cm and a breakdown field strength of $10^6$ V/cm at room temperature. These values remained substantially unchanged over temperatures up to 200° C.

EXAMPLE 9

Polyimide (8) having a molecular weight of 80,000 was synthesized by the reaction between an aromatic tetracarboxylic acid and a diamine having an electron beam-decomposable carbon-carbon single bond:

5 mg of polyimide (8) thus prepared was put in a tungsten boat, which was evacuated into a vacuum of $10^{-6}$ Torr. Then, an electric current was conducted through the boat for the gradual heating. At the same time, the boat was irradiated with an electron beam of 20 KeV. When the boat temperature was elevated to about 200° C., a film thickness meter began to swing. When the film growing rate reached 10 nm/min, a shutter was opened so as to permit a polyimide thin film to be formed on a silicon wafer set at 50° C. by vapor deposition. When measured with a tarry step, the polyimide thin film formed was found to have a thickness of 150 nm.

A change in the electrical insulating properties of the polyimide thin film with temperatures was measured as in Example 1. The polyimide thin film was found to exhibit a resistivity of $10^{16}$ Ω.cm and a breakdown field strength of $10^6$ V/cm at room temperature. These values remained substantially unchanged over temperatures up to 200° C.

EXAMPLE 10

A gold electrode was formed in a comb shape on a glass substrate by means of vacuum vapor deposition, followed by forming a thin film of polyimide (1) having a thickness of 200 nm as in Example 1. Then, another gold electrode was formed in a comb shape on the polyimide thin film by means of vacuum vapor deposition so as to prepare an electric capacitance type humidity sensor. The operating characteristics of the sensor remained unchanged over at least 6 months under temperatures of 10° to 40° C. and humidities of 0 to 100%.

EXAMPLE 11

A thin film of polyimide (1) having a thickness of 800 nm was formed as in Example 1 on a silicon wafer having a diameter of 3 inches and having MOSFETs integrated therein. Then, contact holes were made in the polyimide film, followed by forming an aluminum film on the polyimide thin film by means of vacuum vapor deposition and subsequently patterning the aluminum film so as to form a wiring layer. The operating characteristics of the FET remained unchanged over at least months under temperature of 40° C. and humidity of 80%.

Figure 3:
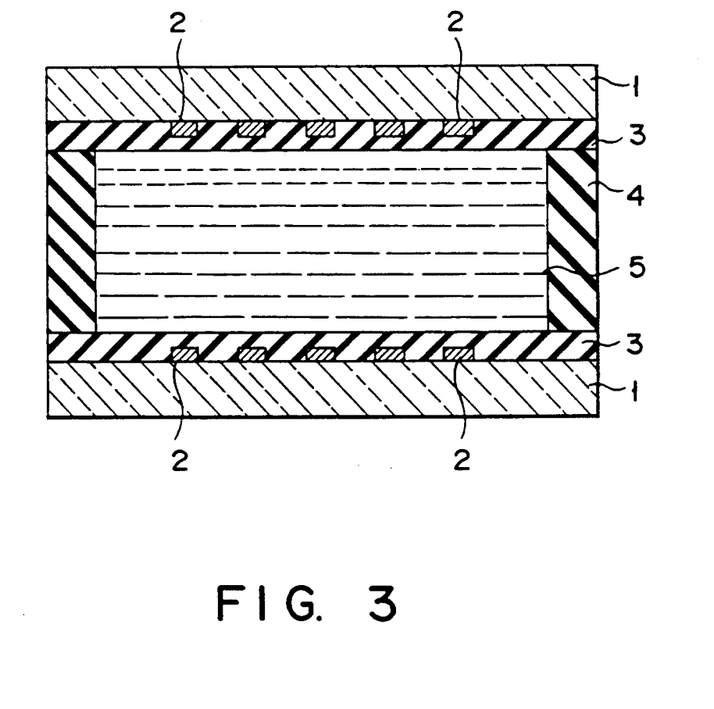
FIG. 3 is a cross sectional view of a liquid crystal element manufactured in Examples 12-14 of the present invention described herein later.

A liquid crystal element constructed as shown in FIG. 3 was manufactured in Examples 12 to 14 described below.

EXAMPLE 12

A transparent electrode 2 consisting of a patterned NESA film was formed on a glass substrate 1. The substrate 1 was then disposed with an inclination of 10° at a position 10 cm apart from a boat of a vapor deposition apparatus.

3 mg of polyimide (1) was put in a tungsten boat, which was evacuated to a vacuum of $10^{-6}$ Torr. Then, an electric current was conducted through the boat for the gradual heating. When the boat temperature was elevated to about 500° C., a film thickness meter began to swing. When the film growing rate reached 10 nm/min, a shutter was opened so as to permit a polyimide thin film to be formed on a silicon wafer by vapor deposition. When measured with a tarry step, a polyimide liquid crystal orientation film 3 having a thickness of 80 nm was found to have been formed.

A liquid crystal cell was assembled by using a sealant 4, and CS1011 (trade name of a ferroelectric liquid crystal manufactured by Chisso K.K.) was injected into the cell so as to form a liquid crystal layer 5. Then, the injection port was sealed. The directions of vapor deposition on the two substrates were in parallel or in antiparallel.

The liquid crystal cell thus prepared was sandwiched between two polarizing plates (cross-Nicol) and rotated. The cell was found dark when the polarization directions of the polarizing plates were in parallel or perpendicular with the direction of vapor deposition, and was found bright when the polarization directions of the polarizing plates made an angle of 45° with the direction of vapor deposition. This clearly indicates that the molecules of the ferroelectric liquid crystal were oriented substantially in the direction of vapor deposition.

A voltage of ±11 V was applied across the electrodes formed on the upper and lower substrates, obtaining a uniform response of the liquid crystal in the electrode portion. The response time at 20° C. was about 1 ms. A highest contrast was obtained when the direction of orientation made an angle of 18 to 22 with the direction of vapor deposition.

EXAMPLE 13

A polyimide liquid crystal orientation film 3 and a liquid crystal cell were prepared as in Example 12, except that polyimide (2) was used in Example 13. A voltage of ±11 V was applied across the electrodes formed on the upper and lower substrates, obtaining a uniform response of the liquid crystal in the electrode portion. The response time at 20° C. was about 1 ms.

EXAMPLE 14

A polyimide liquid crystal orientation film 3 and a liquid crystal cell were prepared as in Example 12, except that polyimide (1) was subjected to sputtering with argon ions in Example 14. A voltage of ±11 V was applied across the electrodes formed on the upper and lower substrates, obtaining a uniform response of the liquid crystal in the electrode portion. The response time at 20° C. was about 1 ms.

Additional advantages and modifications will readily occur to those skilled in the art. Therefore, the invention in its broader aspects is not limited to the specific details, and illustrated examples shown and described. Accordingly, various modifications may be made without departing from the spirit or scope of the general inventive concept as defined by the appended claims and their equivalents.

What is claimed is:

1. A method of manufacturing a polyimide thin film, in which energy is imparted under vacuum to polyimide having in the polymer main chain imide bonds and decomposable bonds differing from imide bonds so as to break the decomposable bonds and, thus, to form a polyimide thin film on a substrate.

2. The method according to claim 1, wherein said decomposable bond is selected from the group consisting of carbon-carbon single bond, carbon-oxygen single bond, carbon-sulfur single bond, oxygen-silicon single bond carbon-silicon single bond, carbon-nitrogen single bond and silicon-silicon single bond.

3. The method according to claim 1, wherein said polyimide has a molecular weight of at least 10,000.

4. The method according to claim 1, wherein energy is imparted to the polyimide by means of heating, sputtering, light irradiation, electron beam irradiation, irradiation with high energy radiation or a combination thereof.

5. The method according to claim 1, wherein the growing rate of the polyimide thin film is set at 1 to 100 nm/min.

6. The method according to claim 1, wherein the temperature of said substrate is set at 50° to 200° C.

7. A method of manufacturing a polyimide liquid crystal orientation film, in which energy is imparted under vacuum to polyimide having in the polymer main chain imide bonds and decomposable bonds differing from imide bonds so as to break the decomposable bonds and, thus, to form a polyimide thin film on a substrate in an oblique direction relative to the substrate.

8. The method according to claim 7, wherein said decomposable bond is selected from the group consisting of carbon-carbon single bond, carbon-oxygen single bond, carbon-sulfur single bond, oxygen-silicon single bond, carbon-silicon single bond, carbon-nitrogen single bond and silicon-silicon single bond.

9. The method according to claim 7, wherein said polyimide has a molecular weight of at least 10,000.

10. The method according to claim 7, wherein energy is imparted to the polyimide by means of heating, sputtering light irradiation, electron beam irradiation, irradiation with high energy radiation or a combination thereof.

11. The method according to claim 7, wherein the growing rate of the polyimide thin film is set at 1 to 100 nm/min.

12. The method according to claim 7, wherein the temperature of said substrate is set at 50° to 200° C.

* * * * *